United States Patent [19]
Zahorsky et al.

[11] Patent Number: 5,956,228
[45] Date of Patent: Sep. 21, 1999

[54] ELECTRICAL EQUIPMENT CASE

[75] Inventors: David J. Zahorsky, Lawrenceville; Allan D. Zamparelli, Trenton, both of N.J.; Arthur R. Troup, Holtwood; Alfred E. Fazio, Havertown, both of Pa.; Charles S. Hall, Essex Fells, N.J.

[73] Assignee: National Railroad Passenger Corporation, Washington, D.C.

[21] Appl. No.: 08/934,904

[22] Filed: Sep. 22, 1997

[51] Int. Cl.⁶ ...................................................... H05K 7/20
[52] U.S. Cl. .......................... 361/695; 165/286; 454/184
[58] Field of Search .................................. 165/234, 284, 165/286; 361/688, 690–695; 454/184, 238, 255

[56] References Cited

U.S. PATENT DOCUMENTS

| | | |
|---|---|---|
| 2,756,369 | 7/1956 | Gorrie . |
| 3,210,456 | 10/1965 | Skubal . |
| 3,335,380 | 8/1967 | Gramlich et al. . |
| 3,378,320 | 4/1968 | Morgan et al. . |
| 3,611,906 | 10/1971 | Lorenz ..................................... 454/238 |
| 3,771,293 | 11/1973 | Vest . |
| 4,106,076 | 8/1978 | Miller et al. . |
| 4,445,162 | 4/1984 | Hamm et al. . |
| 4,817,865 | 4/1989 | Wray ....................................... 361/695 |
| 4,821,143 | 4/1989 | Holmgren et al. . |
| 5,025,171 | 6/1991 | Fanta et al. . |
| 5,121,291 | 6/1992 | Cope et al. ............................. 361/695 |
| 5,354,411 | 10/1994 | Lines . |
| 5,378,058 | 1/1995 | Tessmer . |
| 5,426,567 | 6/1995 | Opeka . |
| 5,491,610 | 2/1996 | Mok et al. .............................. 361/695 |
| 5,676,596 | 10/1997 | Masek ..................................... 454/255 |

FOREIGN PATENT DOCUMENTS

| | | | |
|---|---|---|---|
| 3211796 | 9/1991 | Japan ..................................... | 361/692 |

OTHER PUBLICATIONS

Brinkman et al., IBM Tech. Disl. Bulletin "Automated Cooling Air Supply" vol. 27, No. 6, pp. 3584–3585 361/695, Nov. 1984.

Gupta et al., IBM Tech. Disl. Bulletin "Protection Device For Fluid–Cooled Electrical Apparatus", vol. 24, No. 2. pp. 955–956 361/691, Jul. 1981.

*Primary Examiner*—Gregory Thompson
*Attorney, Agent, or Firm*—Lowe Hauptman Gopstein Gilman & Berner

[57] ABSTRACT

An electronic cabinet assembly is disclosed which is positioned in an exterior environment, such as a railway tunnel. The cabinet assembly includes an electronic cabinet having a box portion and at least one door together defining an interior space. The door has an open position for providing access to the interior space and a closed position where the door is in sealed relation to the box portion. The electronic cabinet includes one or more vents. A fan is in communication with the exterior of the cabinet, and with the interior space. A pressure sensing device is electrically connected to the fan and is in communication with the exterior of the cabinet and with the interior space for actuating the fan in response to sensing a predetermined pressure differential between the exterior of the cabinet and the interior space.

27 Claims, 3 Drawing Sheets

ELECTRICAL EQUIPMENT CASE

FIELD OF THE INVENTION

The present invention relates generally to electrical equipment cases, and more particularly, to electrical equipment cases usable in environments where the outside ambient pressure changes as a result, for example, of a train entering a railroad tunnel and where dust and debris are present.

BACKGROUND OF THE INVENTION

Electronic equipment cases used in environments such as railway tunnels, mining operations, hydroelectric plants, sewer and pipe line installations, and highway tunnels and bridges, are subject to the accumulation of dust and debris within the electronic cabinet enclosure.

For example, in the case of a railway tunnel, a train creates a tremendous pressure as it enters the tunnel. Dust and other foreign matter, due to tunnel drilling, wear of metal wheels, and the like are forced into the electronic enclosure and dust and debris accumulates therein.

In the case of electronic enclosures used in railway tunnels, these enclosures typically house relay and switching gear critical to track operation. The switching gear may be adversely affected by debris and dust accumulating therein as well. This equipment also, in some instances, includes devices which generate heat and therefore there is a need to provide for heat exchange between the inside of the enclosure and the exterior environment.

It has been appreciated in the electronic arts that heat exchange is needed to cool electronic components within electronic modules. For example, U.S. Pat. No. 4,106,076 discloses a plurality of fans for circulating air within an electronic enclosure.

It has also been appreciated in the railroad arts that air cleaner systems which filter air for cooling electrical equipment are provided on diesel-electrical locomotives. See U.S. Pat. No. 3,771,293.

Up to this point, the art has failed to recognize the need for an electronic enclosure for use in an environment such as a railway tunnel in which an electronic cabinet assembly has a fan and a filter activated by a differential pressure switch for increasing the interior pressure to a level at or above the external pressure to prevent dust and/or debris from entering the interior environment and for providing heat exchange.

Another drawback of previous electronic enclosure is that these enclosures had multiple locks to keep the door shut. This is a regulatory requirement to have a lock for each door and failure to insure that each door is locked can result in citations and fines. Yet a further drawback of previous electronic enclosures is that they each were custom fabricated and not readily expandable.

SUMMARY OF THE INVENTION

It is, therefore, an object of the invention to provide an electronic enclosure assembly capable of keeping dust and debris from entering the enclosure.

It is another object of the invention to provide an electronic enclosure assembly in which external pressure is sensed and internal pressure of the electronic enclosure assembly is maintained at a level above ambient pressure.

It is yet a further object of the present invention to provide an electronic enclosure assembly having a fan assembly for providing heat exchange.

It is a further object of the present invention to provide an electronic enclosure assembly having at least one door that can be locked by a single locking mechanism.

It is also an object of the present invention to provide an electronic module which is modular in construction, permitting any number of enclosures to be connected together.

It is another object of the invention to provide an electronic enclosure assembly usable in a harsh environment such as a railway tunnel.

These and other objects of the present invention are achieved by an electronic cabinet assembly positioned in an exterior environment. The electronic cabinet assembly includes an electronic cabinet having a box portion and at least one door together defining an interior space. The door has an open position for providing access to the interior space and a closed position where the door is in sealed relation to the box portion. The electronic cabinet includes one or more vents. A fan is in communication with the exterior of the cabinet and with the interior space. A pressure sensing device is electrically connected to the fan and is in communication with the exterior of the cabinet and with the interior space for actuating the fan in response to sensing a predetermined pressure differential between the exterior of the cabinet and the interior space.

These objects are also achieved by providing an electronic enclosure assembly having at least one door that can be locked by a single locking mechanism. These and other objects are achieved by connecting a second electronic cabinet to one end of the first electronic cabinet.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein.

DETAILED DESCRIPTION OF THE PREFERRED EMBODIMENTS

Figure 1:
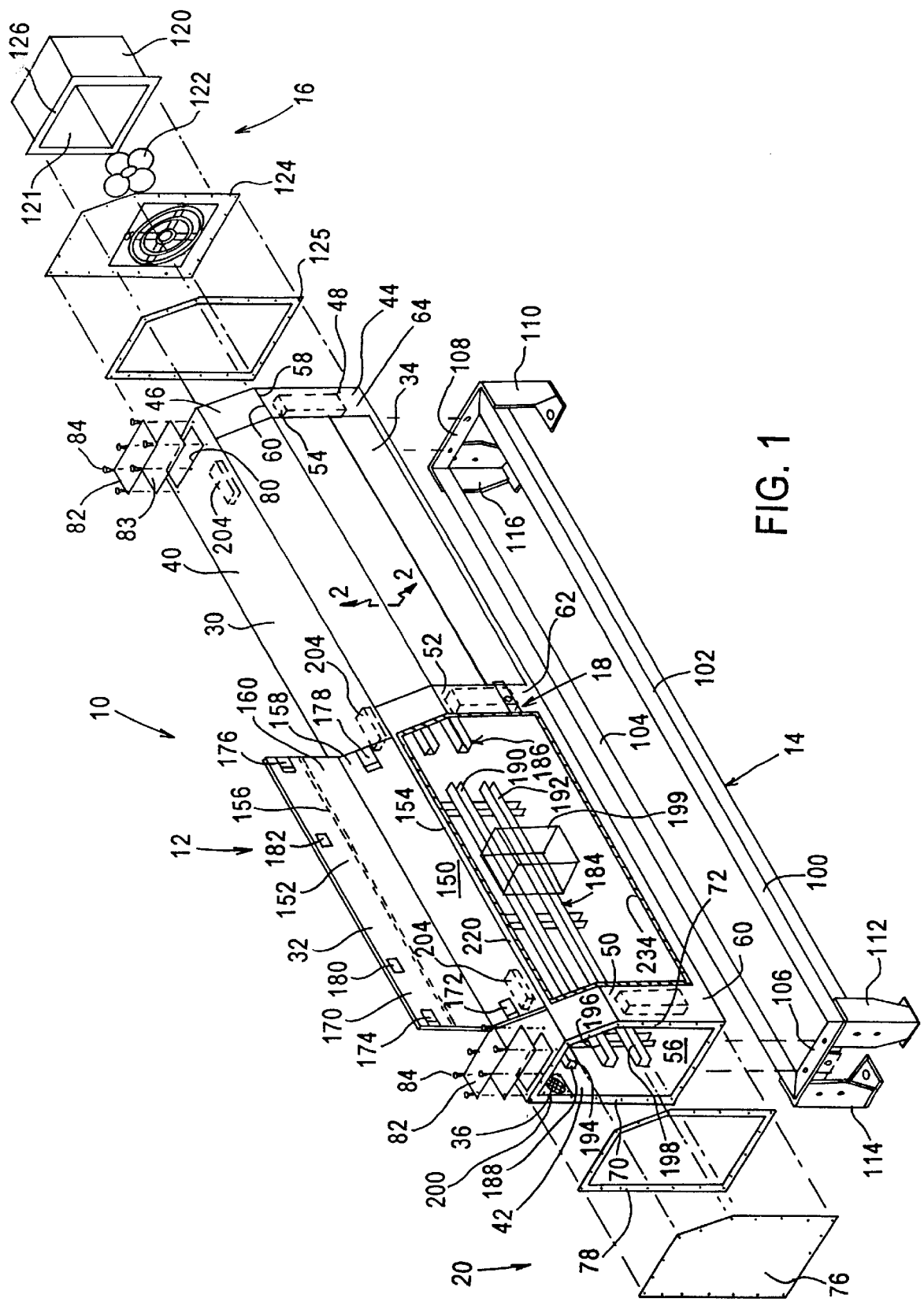
FIG. 1 is an exploded perspective view of the electronic cabinet assembly according to the present invention.

Refer now to FIG. 1 where an electronic cabinet assembly 10 is illustrated which is constructed in accordance with the principles of the present invention. The electronic cabinet assembly 10 is preferably designed to house signal equipment for railway train control within a railway tunnel. The electronic cabinet assembly 10 includes an electronic cabinet 12, a stand 14, a fan enclosure assembly 16, a lock assembly 18, and an end plate assembly 20. As described herein, the preferred embodiment of the electronic cabinet assembly 10 would typically be positioned in a railway tunnel although it is envisioned that the invention would be equally advantageous when positioned in any environment where dust and debris are forced into the assembly because the outside ambient pressure increases above that of enclosure due to the approach of an oncoming train. Examples of other environments include mining operations, hydroelectric plants, sewer and pipe installations and highway tunnels and bridges.

For convenience, the invention will be described in relation to the orientation depicted in FIG. 1, and consequently, terms such as "above," "below," "left," and "right," as used herein are to be construed in the relative sense.

Electronic cabinet 12 includes a box portion 30, a left door assembly 32, a right door assembly 34, and a plurality of electrostatic vent assemblies 36.

Box portion 30 is welded together from type 304 stainless steel and includes an elongate flat horizontally extending top plate 40, an elongate flat vertically extending back plate 42 coextensive with top plate 40, a front plate 44 coextensive with top plate 40, an angled portion 46 and a vertical portion 48. Front plate 44 has a left portion 50 disposed between end plate assembly 20 and left door assembly 32, a center portion 52 disposed between left door assembly 32, and right door assembly 34, and a right portion 54 disposed between right door assembly 34 and fan enclosure assembly 16. A flat elongate bottom plate 56 connects front plate 44 and back plate 42. Thus, box portion 30 defines an elongate essentially rectangular shaped box which is 18 inches high×22 inches wide×10 feet long and has left and right openings 62, 64 at opposite ends thereof. Advantageously angled portion 46 provides a contour to box portion 30 to permit easy passage past the enclosure by an individual within the confines of the tunnel.

Formed at open opposite ends of box portion 30 and extending inwardly from top plate 40, back plate 42, front plate 44 and bottom plate 56 are left and right flanges 70, 72, respectively, extending into openings 62, 64, respectively. A gasket 78 having a shape corresponding to flange 70 is disposed between flange 70 and end plate 76. End plate 76 is flat stainless steel plate and has a peripheral shape corresponding to box portion 30. A plurality of bolts (not shown) extend through end plate 76 and gasket 78 to close left opening 62 to form a sealed connection between end plate 76 and box portion 30. Advantageously, flanges 70, 72 have the same bolt pattern for the installation of end plates, fan assemblies, and additional electronic enclosure assemblies as discussed in detail below.

Formed in top plate 40 are a plurality of rectangular openings 80, as shown in FIG. 1, disposed above left portion 50 and right portion 54, respectively for allowing cable access therethrough. Mounted above openings 80 are a corresponding plurality of stainless steel rectangular cable access plates 82 and rectangular cable plate seals 83 connected to top plate 40 by a plurality of bolts 84. Cable access plates 82 are adapted for panduit tubing for protecting electrical cabling which is connected to the electronic cabinet assembly 10 therethrough.

Stand 14 has a base 100 formed of a front rail 102, a rear rail 104, a left rail 106 and a right rail 108 each formed of an L-shaped angle iron and welded together into a unitary structure. Stand 14 has a right front leg 110, a left front leg 112, a left rear leg 114, and a right rear leg 116 each approximately 6 inches in height which are welded to a respective corner of base 100 for supporting electronic cabinet assembly 12 above the tunnel floor. Base 100 has a perimeter corresponding to the perimeter of bottom plate 56 and is mounted thereto by bolts (not shown).

Fan assembly 16 includes a fan enclosure housing 120, a fan assembly 122 and a restrictor plate 124. Fan housing 120 is a rectangular box having an open end 121 and has a fan assembly 122 mounted therein for rotational movement. Restrictor plate 124 is disposed between fan housing 120 and a gasket 125. Fan housing 120 has a flange 126 for mounting fan housing 120 to flange 72. Restrictor plate 124 has a periphery corresponding to box portion 30 so that right opening 64 is sealed when restrictor plate 124, gasket 125 and fan housing 120 are mounted thereto. A plurality of bolts extend through flange 126, restrictor plate 124, gasket 125 and into right flange 72. Fan assembly 122 is a 25 CFM electrically powered fan which can be controlled either manually or through pressure differential switch 22.

As shown in FIG. 1, left door assembly 32 is shown in an open position, and right door assembly 34 is shown in a closed position. Formed within front plate 44 is an essentially rectangular left opening and right opening 130, 132. For the sake of brevity, only the details of left door assembly 32 will be described herein as right door assembly 34 is identical except for placement. Left opening 130 is formed between left portion 60 and center portion 62 and extends vertically from near top plate 40 to near bottom plate 56. Left door assembly 32 is formed from an elongate stainless steel top door panel 150 and a coextensive elongate stainless steel lower door panel 152. A top hinge assembly 154 hingedly mounts top door panel 150 to box portion 30. A lower hinge 156 hingedly connects lower door panel 152 to top door panel 150. Hinges 154, 156 are continuous hinges which extend for the entire length of door assembly 32. Top door panel 150 has an angled portion 158 connected to a vertical portion 160. Left door assembly 32 has an inner surface 170 and attached thereto are a plurality of aircraft type latches 172, 174, 176, 178, 180, 182. Latch 172 is attached to a left inside surface of top door panel 150, latch 174 attached to a left inside surface of lower door panel 152, latch 176 attached to a right inner surface of lower door panel 152, latch 178 is attached to a right inner surface of lower door panel 152, latch 180 is attached to a left lower inner surface of door panel 152 and latch 182 is attached to a right inner surface of door panel 152.

Attached to back plate 42 of box portion 30 are left and right Uni-strut® assemblies 184, 186, respectively. Each assembly 184, 186 includes three spaced apart vertically disposed Uni-struts®, 188, 190, 192 attached to back plate 42. Attached to each Uni-strut® 188, 190, 192 are three spaced apart horizontally disposed Uni-struts® 194, 196, 198. A plurality of electronic modules 199 can be connected to each Uni-strut® assembly 184, 186. Each electronic module is advantageously front wired so that each module is easily assessable by a technician when either the door assembly 32 or right door assembly 34 is open. It should be appreciated that the use of Uni-strut® allows for the universal sizing of mounting brackets to which electronic modules can be mounted. These electronic modules improve wiring efficiency which permits maintenance to be performed in a shop rather than in the tunnel.

The plurality of vent assemblies 36 are mounted into openings in back plate 42. The vent assemblies 36 include a replaceable electrostatic filter 200. A plurality of lights 204 are mounted within box portion 30 for working in dark conditions.

Referring again to FIG. 1, left door 32 is depicted in an open position. It should be noted that as illustrated in FIG. 1, lower door panel 152 extends vertically upwards, although, as will be recognized, lower door panel 152 would normally extend vertically downwards and rearward as depicted in FIG. 1. As depicted in FIG. 1, it will be noted that door assembly 32 and angled portion 46 are constructed such that door assembly 32 will tend to stay in the open position once moved to the open position.

Figure 2:
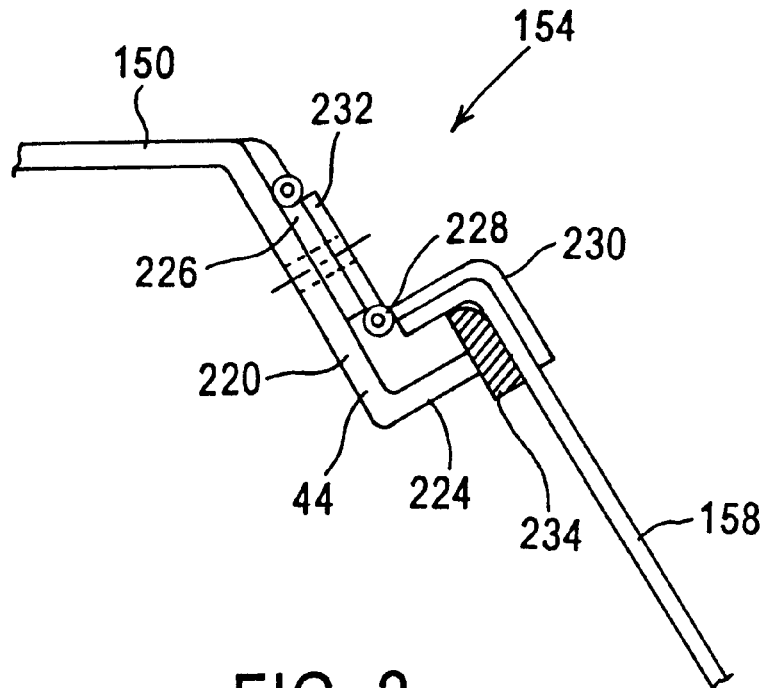
FIG. 2 is a partial cross-sectional view of the top hinge assembly taken along line 2—2 in FIG. 1.

Refer now to FIG. 2 where a cross-sectional view of the top hinge assembly 154 is depicted. Front plate 44 has a left door portion 220 and a right door portion (not shown). Extending obliquely upwardly from left door portion 220 is an obliquely extending portion 224. Portion 224 extends around the entire periphery of left opening 130. Hinge assembly 154 includes a elongate mounting block 226, a hinge 228, an L-shaped member 230 hingedly connected to one side of hinge 228, and a flat member 232 connected to the other side of hinge 228. Flat member 232 and mounting block 226 each have a corresponding plurality of bolt holes through which bolts (not shown) mount hinge assembly 154 and door assembly 32 to box portion 30. L-shape member 230 is welded to angled portion 158 of door assembly 32. Mounted to oblique extending portion 224 is a gasket 234 which extends around the inner periphery of door opening 130. Seal 234 is compressed when door assembly 32 is in the closed position.

Figure 3A:
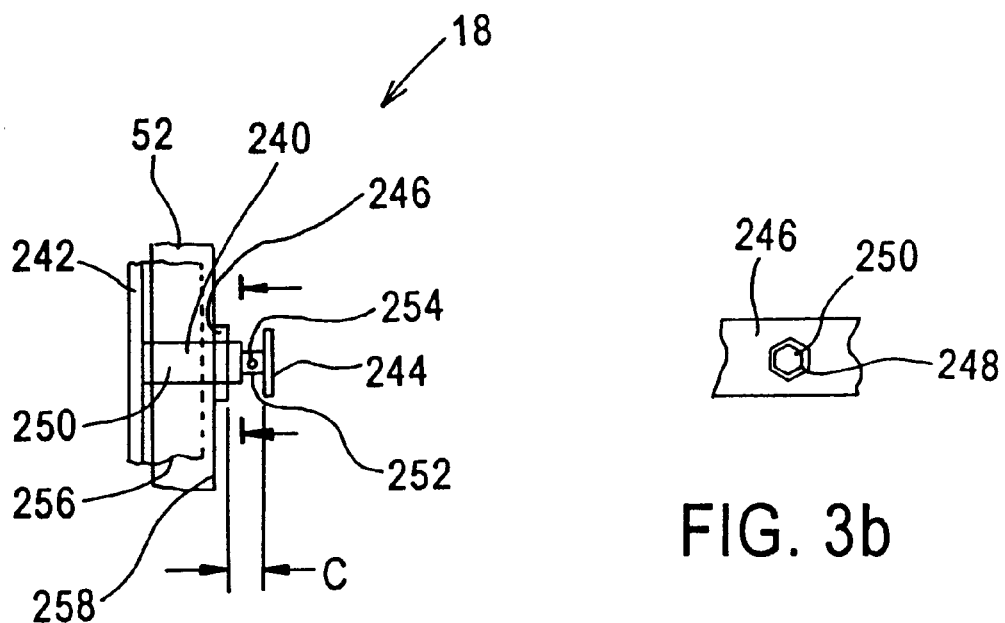
FIG. 3a is a side elevational view of the lock mechanism shown in FIG. 1.
Figure 3B:
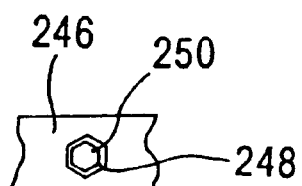
FIG. 3b is a front-elevational view of the lock mechanism shown in FIG. 3.

Refer now to FIGS. 3a and 3b where side and front elevational views of lock assembly 18 are illustrated. Lock assembly 18 is mounted through a hole in center portion 52. Lock assembly 18 includes a center bar 240, a rear portion 242, a weld-on cap 244, and a hex bar having a hexagonal hole 248 formed therein. Hexagonal bar 246 is welded to the front surface of center portion 52 and hexagonal hole 248 is aligned with a hole in center portion 52. Extending through the hole in center portion 52 is center bar 240. Center bar 240 has a rear hexagonal portion 250 best shown in FIG. 3b, and a front cylindrical portion 252. Cylindrical portion 252 has a transverse hole 254 machine therethrough. Rear portion 242 is attached to center bar 240 and is disposed within the interior space of box portion 30. Rear portion 242 has a forwardly extending portion 256 spaced from an inner surface 258 of center portion 52. Weld-on cap 244 has an elongate rectangular shape and is welded on to cylindrical portion 252. Hexagonal hole 248 is disposed such that weld-on cap 244 can be positioned in a substantially horizontal position as shown in FIG. 3b, or a substantially vertical position (not shown).

Referring back to FIG. 1, lock assembly 18 is shown in the closed position. It should be appreciated that the lock assembly 18 when moved into the closed position with left or right door assemblies 32, 34 open permits left and right door assemblies 32, 34 to remain in the open position with no possibility of the doors being accidentally closed. The operation of locking assembly 18 will now be discussed. As depicted in FIG. 2, clearance C must be of a sufficient distance to allow clear rotation of hex bar 246. In the locked position, hexagonal portion 250 is forwardly positioned and is engaged with hexagonal hole 248 whereas in the open position, hexagonal portion 250 is rearwardly positioned and cylindrical portion 252 permits hex bar 246 to be rotated. As illustrated in FIG. 1, when lock assembly 18 is in the closed horizontal position, hex bar 246 is of sufficient length to have opposite ends each extend over respective portions of lower door panels 152 of left and right door assemblies 32, 34. In the open vertical position, hex bar 246 does not interfere with the opening and closing of door assemblies 32 and 42, respectively. Lock assembly 18 complies with applicable FRA regulations which require that each enclosure be secured with only one lock. In the closed position, with left and right door assemblies in the closed position, a pad lock can be placed through transverse hole 254 and rear portion 242 prevents lock assembly 18 from being removed.

As previously mentioned, electronic cabinet assembly 10 is positioned in, for example, a railway tunnel. Normally, the pressure inside electronic cabinet assembly 10 is equal to the ambient pressure in the railway tunnel. However, when a train enters the tunnel, the ambient pressure outside electronic cabinet assembly 10 will increase. Using prior art devices, this increase in pressure would cause dust and debris to enter into the electronic cabinet assembly 10. Advantageously, the present invention provides for a differential pressure switch 22 electrically connected to fan assembly 16 to actuate fan assembly 16 in response to sensing a predetermined pressure differential between the exterior of the cabinet and the interior space due to the approach of an oncoming train. The actuation of fan assembly 16 provides two benefits, that is, the prevention of dust and debris being forced into the electronic cabinet assembly 10 and also provides heat exchange for electronic components mounted within assembly 10 which generate heat. Fan assembly 16 can also be run in a reverse direction so as to suck out any dust or debris that may have accumulated in box portion 30, perhaps when the door assemblies 32, 34 were open for maintenance. Preferably, fan assembly 16 is located on the end of electronic cabinet assembly 10 which would face the train as the train approaches electronic cabinet assembly 10.

Figure 4:
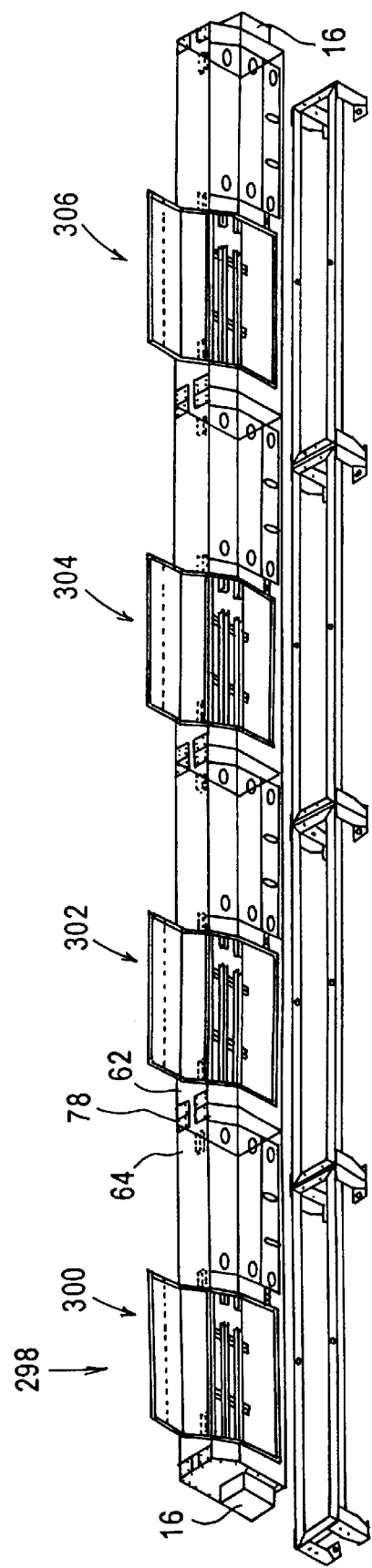
FIG. 4 is an exploded perspective view depicting an array of four electronic cabinet assemblies each spaced above a respective stand for ease of illustration.

Refer now to FIG. 4 illustrating an exploded perspective view, depicting an array of four electronic cabinet assemblies 298, each spaced above a respective stand. As depicted in FIG. 4, four electronic cabinet assemblies 300, 302, 304, 306 are illustrated, although it will readily be recognized that any such number could be used. Advantageously, the electronic cabinet assemblies of the present invention are modular in design, permitting any number of such assemblies can be connected together. Assemblies 300, 302, 304, 306 have the same construction as discussed above with respect to electronic enclosure assembly 10 and so these details need not be repeated. Assemblies 300 and 306 each have a respective fan assembly 16 mounted on one end thereof. Assembly 300 has its right open end 64 adjacent the left open end 62 of assembly 302. Likewise, assembly 302 has its right open end 64 adjacent the left open end of assembly 304. Similarly, right open end of 304 is adjacent left open end of assembly 306. Gaskets 78 are disposed between assemblies 302, 304, and assemblies 304, 306. Open flow is, thus, realized between assemblies 300, 302, 304, 306 such that when fan assemblies 16 are activated, dust and debris is prevented from entering each enclosure. Because assemblies 300, 302, 304, 306 only differ from electronic cabinet assembly 10 in that in forming a plurality of enclosures in array, only the differences between forming the array of enclosures will be discussed.

It should now be apparent from the foregoing detailed description that an electronic cabinet assembly has been described that can advantageously prevent dust and debris from entering the assembly when the external ambient pressure rises. It should also be apparent that an electronic cabinet assembly has been described which can advantageously exchange heat to the outside environment without allowing dust and debris to enter the cabinet. It should further be appreciated that an electronic cabinet has been described that allows easy access to a technician to perform maintenance on the electronic modules placed therein. It should also be apparent that electronic cabinet assembly has been described that is modular in construction, with respect to internal configuration, and because of its modular cabinet configuration, can be enlarged without difficulty. It should also be appreciated that an electronic cabinet assembly has been described wherein the cabinet can be locked closed with a single locking mechanism.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

We claim:

1. An electronic cabinet assembly to be positioned in an exterior environment, comprising:

an electronic cabinet having a box portion and at least one door together defining an interior space, said door having an open position for providing access to said interior space and a closed position where said door is in sealed relation to said box portion and wherein said electronic cabinet includes one or more vents;

a fan mounted to the cabinet in communication with the exterior environment of said cabinet and with said interior space;

a pressure sensing device electrically connected to said fan for actuating said fan in response to sensing a predetermined pressure differential between the exterior of said cabinet and said interior space.

2. The electronic cabinet assembly of claim 1, further comprising an electronic device which generates heat during operation.

3. The electronic cabinet assembly of claim 1, further comprising a plurality of latch mechanisms each of which is mounted to said door.

4. The electronic cabinet assembly of claim 1, further comprising a lock mechanism for locking said door in said closed position.

5. The electronic cabinet assembly of claim 1, wherein said pressure sensing device is responsive to a pressure differential generated by the approach of an oncoming train within the tunnel in which said cabinet assembly is mounted.

6. The electronic cabinet assembly of claim 1, further comprising one or more electronic modules mounted within said electronic cabinet.

7. The electronic cabinet assembly of claim 1, further comprising an hermetic seal mounted between said box portion and said door.

8. The electronic cabinet assembly of claim 1, wherein said door is hingedly mounted to said box portion along a top surface thereof and along an upper edge of said door.

9. The electronic cabinet assembly of claim 2, wherein said electronic device is a converter.

10. The electronic cabinet assembly of claim 1, further comprising a fan enclosure mounted externally from said electronic cabinet and having said fan disposed therein.

11. The electronic cabinet assembly of claim 1, further including an electrostatic filter disposed in a respective one or more vents.

12. The electronic cabinet assembly of claim 1, wherein said fan, while running, maintains the pressure within said interior space at a pressure level equal to or greater than an exterior pressure.

13. The electronic cabinet assembly of claim 1, wherein said door has a top door panel and a lower door panel hingedly connected to said top door panel, said top door panel hingedly connected to a top surface of said box portion.

14. The electronic cabinet assembly of claim 1, wherein said box portion has a top plate and a front plate, said front plate having a vertical portion and an angled portion, said angled portion being disposed between said vertical portion and said top plate.

15. The electronic cabinet assembly of claim 1, further comprising a locking mechanism for locking said door in said closed position.

16. The electronic cabinet assembly of claim 1, wherein said cabinet assembly is 10 feet long.

17. The electronic cabinet assembly of claim 1, further comprising a stand on which said electronic cabinet is mounted.

18. The electronic cabinet assembly of claim 1, wherein said electronic cabinet includes a back plate and Uni-strut® brackets mounted thereto.

19. The electronic cabinet assembly of claim 1, wherein said electronic cabinet has an end flange and an end plate and an end gasket disposed therebetween.

20. The electronic cabinet assembly of claim 1, wherein said electronic cabinet includes a front panel, said front panel having a door opening and a gasket placed around the perimeter of said door opening, said door having an inside perimeter surface which is disposed in contact with said gasket when said door is in said closed position.

21. The electronic cabinet assembly of claim 20, further comprising an hermetic seal disposed within said recessed area and attached to said front panel.

22. The electronic cabinet assembly of claim 1, further comprising a second electronic cabinet connected to one end of said electronic cabinet.

23. The electronic cabinet assembly of claim 22, wherein said electronic cabinet and said second electronic cabinet each have a flange, said flanges being in mating relationship and further comprising a gasket mounted between said flanges.

24. The electronic cabinet assembly of claim 22, wherein said interior space of said electronic cabinet is in communication with an interior space of said second electronic cabinet.

25. The electronic cabinet assembly of claim 1, wherein said electronic cabinet includes a back plate having one or more vents formed therein.

26. The electronic cabinet assembly of claim 1, wherein the cabinet assembly is located in one of a train tunnel, hydroelectric plant, mine, sewer and pipe line installation and highway bridges and tunnels.

27. The electronic cabinet assembly of claim 1, wherein said pressure sensing device is a differential pressure switch.

* * * * *